(12) United States Patent
Gamborg et al.

(10) Patent No.: US 9,791,219 B2
(45) Date of Patent: Oct. 17, 2017

(54) METHOD OF FABRICATING A HEAT SINK

(75) Inventors: Gorm Gamborg, Kolding (DK); Preben Bonde, Losning (DK)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 659 days.

(21) Appl. No.: 14/361,222

(22) PCT Filed: Nov. 30, 2011

(86) PCT No.: PCT/US2011/062613
§ 371 (c)(1),
(2), (4) Date: Sep. 17, 2014

(87) PCT Pub. No.: WO2013/081601
PCT Pub. Date: Jun. 6, 2013

(65) Prior Publication Data
US 2015/0034292 A1 Feb. 5, 2015

(51) Int. Cl.
*B21C 23/10* (2006.01)
*F28F 3/04* (2006.01)
(Continued)

(52) U.S. Cl.
CPC ............. *F28F 3/04* (2013.01); *B21C 23/14* (2013.01); *B23P 15/26* (2013.01); *F28F 3/048* (2013.01);
(Continued)

(58) Field of Classification Search
CPC .... F28F 3/04; F28F 21/08; F28F 3/048; F28F 2255/16; B23P 15/26; B23P 2700/10;
(Continued)

(56) References Cited

U.S. PATENT DOCUMENTS

| 4,187,711 | A | | 2/1980 | Lavochkin et al. | |
|---|---|---|---|---|---|
| 6,138,489 | A | * | 10/2000 | Eriksson | B21D 53/02 29/890.03 |
| 6,327,886 | B1 | * | 12/2001 | Eriksson | B21C 23/14 165/80.3 |
| 6,520,248 | B2 | * | 2/2003 | Gailus | H01L 21/4882 165/185 |
| 7,443,678 | B2 | * | 10/2008 | Han | F21K 9/00 165/104.33 |
| 8,365,409 | B2 | * | 2/2013 | Kakiuchi | B23P 15/26 165/157 |

(Continued)

FOREIGN PATENT DOCUMENTS

| CN | 1747639 A | 3/2006 |
|---|---|---|
| CN | 101238575 A | 8/2008 |

(Continued)

OTHER PUBLICATIONS

International Search Report from corresponding PCT/US2011/062613 dated Oct. 25, 2012.

*Primary Examiner* — Jun Yoo
(74) *Attorney, Agent, or Firm* — Lando & Anastasi, LLP

(57) ABSTRACT

A method for fabricating a straight fin heat sink (50) of the type having a base (52) and a plurality of fins (54) extending from the base is disclosed. Each fm (54) of the plurality of fins of the heat sink is spaced from one another a predetermined distance and lies along a plane generally parallel to planes of the other fins of the plurality of fins. The method includes: providing a die (20) configured to produce a heat sink (30) having a base (32) and a plurality of fins (34) attached to be base in a radial fashion about the base from at least one side of the base; extruding a blank of material through the die (20) to produce the heat sink (30); and compressing the plurality of fins (34) with a compression tool (40) so that the plurality of fins (54) extend from the base along planes generally parallel to each other.

8 Claims, 4 Drawing Sheets

(51) Int. Cl.
    *B21C 23/14*         (2006.01)
    *H01L 23/367*      (2006.01)
    *H01L 21/48*        (2006.01)
    *B23P 15/26*        (2006.01)
    *F28F 21/08*        (2006.01)

(52) U.S. Cl.
    CPC .......... *F28F 21/08* (2013.01); *H01L 21/4878* (2013.01); *H01L 23/3672* (2013.01); *B23P 2700/10* (2013.01); *F28F 2255/16* (2013.01); *H01L 2924/0002* (2013.01)

(58) Field of Classification Search
    CPC . B21C 23/14; H01L 21/4878; H01L 23/3672; H01L 2924/0002; H01L 2933/0075; H01L 23/36
    See application file for complete search history.

(56) References Cited

U.S. PATENT DOCUMENTS

2004/0000393 A1* 1/2004 Tavassoli .................. F28F 3/02
                                                                165/80.3

FOREIGN PATENT DOCUMENTS

| CN | 101847586 A | 9/2010 |
|---|---|---|
| DE | 14 52 261 A1 | 2/1969 |
| DE | 198 36 314 A1 | 2/2000 |
| EP | 0 623 952 A1 | 11/1994 |
| JP | S57193049 A | 11/1982 |
| JP | 2001038416 A | 2/2001 |
| WO | 98/51430 A1 | 11/1998 |

\* cited by examiner

METHOD OF FABRICATING A HEAT SINK

This application is a U.S. National Stage Application under 35 U.S.C. §371 from International Application No. PCT/US2011/062613, filed Nov. 30, 2011, which is hereby incorporated by reference in its entirety for all purposes.

BACKGROUND

1. Field of Disclosure

The present disclosure relates generally to the field of electronics and, more particularly, to devices and methods that dissipate heat from electronic components.

2. Discussion of Related Art

Modern electronic components produce excessive amounts of heat during operation. To ensure that the components do not overheat, system designers attach convective heat sinks to cool these components, by providing an efficient heat transfer path from the devices to the environment. A typical convective heat sink is designed to transfer heat energy from the high temperature component to lower temperature of the surrounding air. Such typical heat sinks attach to the components through a base and include fins or pins to increase the surface area of the heat sink within a given space.

FIG. 1 shows a well-known embodiment of a heat sink, which is generally indicated at 10. The heat sink 10 may be extruded from aluminum, having a base 12 and fins, each indicated at 14, that extend from a base 12. As shown in FIG. 1, the fins 14 extend perpendicularly from the base 12. By increasing the surface area of the heat sink 10, the heat transfer capacity of the heat sink increases. The surface area of the heat sink 10 may be increased by extending the fins 14 in one direction away from the electronic component, thus creating an extruded fin profile, or by providing more, smaller fins. The air heated by the component passes through the fins 14, thus transferring heat away from the heat sink 10 to the surrounding environment.

In a conventional extrusion process, aluminum is heated to a temperature just shy of its melting point and pressed through a die. With this process, there is a practical limit to how thin the fins of the heat sink can be relative to its length. There is also a practical limit to how far apart the fins can be spaced from one another relative to the length of the fins. For example, a heat sink produced by the conventional extrusion process can normally achieve a 10:1 ratio of the length of the fin in relation to the distance between adjacent fins.

In order to go beyond the length to distance limit, other techniques for fabricating heat sinks, such as bonded fin heat sinks and folded fin heat sinks, have been employed. However, both of these alternative approaches have drawbacks concerning limited thermal conduction in the assembly in between the base plate and the fins. Further, these known techniques have a considerable higher degree of labor cost and fabrication time cost than extruded heat sinks.

With the extrusion process, the cost of extruded heat sinks is proportional to the weight of the material used due to the fact that a primary cost driver in fabricating the extruded heat sink is the material cost. The most widely used material for heat sinks is aluminum. Extruded heat sinks are less expensive than bonded fin heat sinks and folded fin heat sinks (having equivalent masses) because of the lower labor and machine time costs for extruded heat sinks. However, folded fin heat sinks and bonded fin heat sinks may be formed more compactly with less mass since they can be made with longer, thinner and more closely spaced apart fins. Another drawback, in addition to cost, for the folded fin and the bonded heat sinks is that the connection between the base plate and the fins typically are made by some kind of glue, which has a lower thermal conductivity than solid aluminum.

In systems using forced cooling (for example, using a fan to move air through the heat sink), heat sinks with many thin fins are more efficient than heat sinks with fewer fat fins (having equivalent mass) since in the instance of forced cooling, air at high speed can be pressed between fins that are placed close together. In the instance where thin fins are placed close together, the heat sink has a very large surface compared to the volume. This makes the combination of forced cooling (using a fan) combined with thin fins that are closely space with one another extremely efficient.

SUMMARY OF DISCLOSURE

One aspect of the disclosure is directed to a method for fabricating a straight fin heat sink of the type comprising a base and a plurality of fins extending from the base. Each fin of the plurality of fins is spaced from one another a predetermined distance and lies along a plane generally parallel to planes of the other fins of the plurality of fins. In one embodiment, the method comprises: providing a die configured to produce a heat sink having a base and a plurality of fins attached to the base in a radial fashion about the base from at least one side of the base; extruding a blank of material through the die to produce the heat sink; and compressing the plurality of fins with a compression tool so that the plurality of fins extend from the base along planes generally parallel to each other.

Embodiments of the method further may include segmenting the heat sink to a desired length prior to compressing the plurality of fins. The die may be further configured to produce a heat sink having, for each fin of the plurality of fins, a reduced thickness portion adjacent to a connection of the fin to the base. Adjacent fins of the plurality of fins may be closely spaced to one another. For example, adjacent fins of the plurality of fins may be spaced approximately 2 mm from one another. Compressing the plurality of fins with a compression tool may include providing a compression tool having a plurality of slots that extend from a first end of the compression tool to a second, opposite end of the compression tool, the plurality of slots at the first end of the compression tool being configured to receive the plurality of fins of the heat sink therein, and sliding the plurality of fins of the heat sink through the slots of the compression tool. A spacing of the slots of the compression tool at the second end may be closer together than a spacing of the slots of the compression tool at the first end. The material extruded through the die may be compressed while the material is hot or while the material is cool.

Another aspect of the disclosure is directed to a heat sink comprising a base, and a plurality of fins extending from the base. Each fin of the plurality of fins is spaced from one another a predetermined distance and lies along a plane generally parallel to planes of the other fins of the plurality of fins. Each fin has a reduced thickness portion adjacent to a connection of the fin to the base.

Another aspect of the disclosure is directed to a method for fabricating a straight fin heat sink of the type comprising a base and a plurality of fins extending from the base, each fin of the plurality of fins being spaced from one another a predetermined distance and lying along a plane generally parallel to planes of the other fins of the plurality of fins. In one embodiment, the method comprises: providing a die configured to produce a heat sink having a base and a plurality of fins attached to be base, the die having a first end having a first opening to produce the base of the heat sink and a plurality of first slots extending from one side of the first opening in a radial fashion about the first opening to produce the plurality of fins of the heat sink, and a second end having a second opening corresponding to the first opening of the first end and a plurality of second slots extending from one side of the second opening along planes generally parallel to each other, the plurality of second slots of the second end corresponding to the plurality of first slots of the first end; and extruding a blank of material through the die to produce the heat sink.

Another aspect of the disclosure is directed to a tool set for extruding a straight fin heat sink of the type comprising a base and a plurality of fins extending from the base. Each fin of the plurality of fins is spaced from one another a predetermined distance and lies along a plane generally parallel to planes of the other fins of the plurality of fins. In one embodiment, the tool set comprises a die configured to produce a heat sink having a base and a plurality of fins attached to be base in a radial fashion about the base from at least one side of the base, and a compression tool having a plurality of slots that extend from a first end of the compression tool to a second, opposite end of the compression tool. The plurality of slots at the first end of the compression tool is configured to receive the plurality of fins of the heat sink therein.

Embodiments of the tool set may include spacing the slots of the compression tool at the second end closer together than spacing of the slots of the compression tool at the first end. The die further may be configured to produce a heat sink having, for each fin of the plurality of fins, a reduced thickness portion adjacent to a connection of the fin to the base.

Still other aspects, embodiments, and advantages of these exemplary aspects and embodiments, are discussed in detail below. Any embodiment disclosed herein may be combined with any other embodiment in any manner consistent with at least one of the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the disclosure. In the figures:

DETAILED DESCRIPTION

As discussed above, traditional heat sinks suffer from several disadvantages, such as being increasingly large, heavy and costly. Accordingly, there is a need for a more efficient device, system and method of heat dissipation that would be lighter and easier to construct. Aspects and embodiments are directed to methods of fabricating heat dissipation devices that overcome the limitations and drawbacks of conventional solutions, while providing a solution that is functionally uncomplicated and easy to implement. As used herein, the term "heat-generating component" may refer to any electronic components or a group of components that generate heat, for example semiconductor devices, such as bipolar junction transistors, MOS-FETs, diodes or IGBTs, to name a few.

The methods disclosed herein address the limitation of extruded heat sinks having relatively long fins and relatively short spaces between adjacent fins. This limitation emerges from the physics of the extrusion die, which have a limit as to how long and thin the fins and the space between adjacent fins can be formed. To address these limitations a method for fabricating a heat sink having flared fins that fan out from a base of the heat sink is disclosed herein. A die configured for creating a heat sink having flared fins is provided. Once the heat sink is extruded, a compression tool is used to manipulate the fins of the heat sink to create a heat sink having parallel fins.

Figure 1:
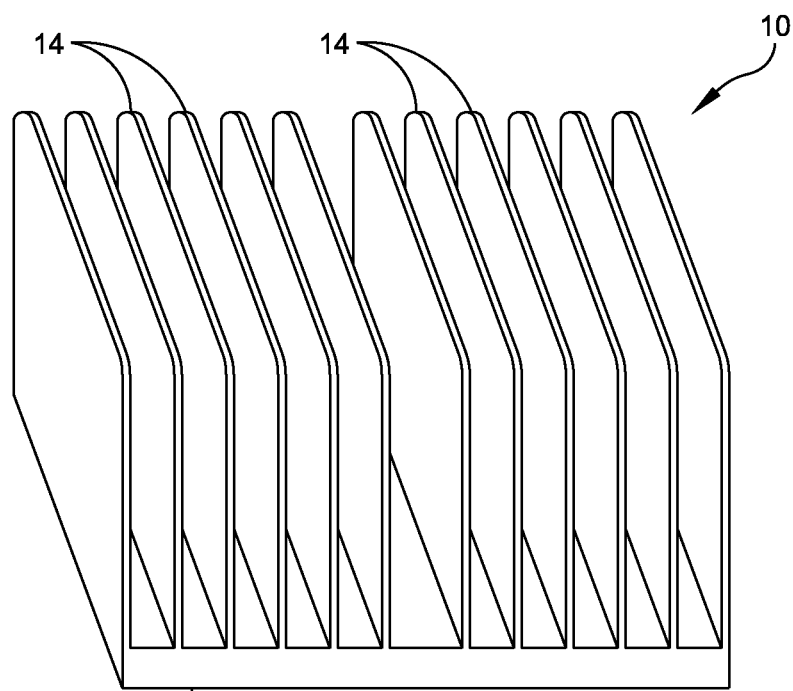
FIG. 1 is a perspective view of one example of a typical heat sink, according to aspects of the prior art.
Figure 2:
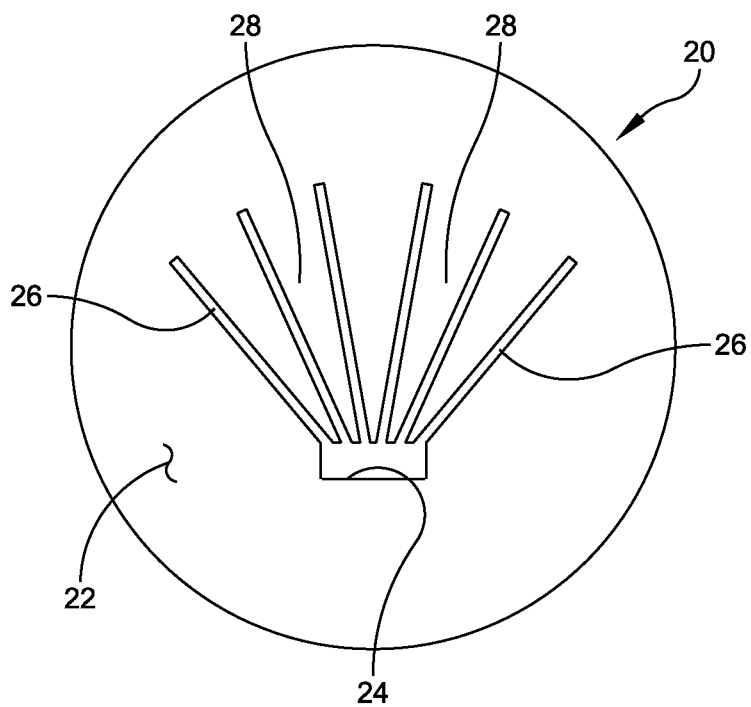
FIG. 2 is an end view of a die used to extrude a heat sink of embodiments of the present disclosure.

Referring to the drawings, and more particularly to FIG. 2, a die is generally indicated at 20. As shown, the die 20 is configured to produce a heat sink having a base and a plurality of fins attached to one side of the base in a radial fashion about the base. In one embodiment, the die 20 includes a body having an end 22 (shown in FIG. 2) with an opening 24 formed therein that is sized to produce the base of the heat sink and several slots, each indicated at 26, extending from one side of the opening in a radial fashion about the opening to produce the fins of the heat sink. In a certain embodiment, the opening 24 may be configured to produce a base having a flat portion and a rounded portion from which the slots 26 extend. As shown, triangular portions, each indicated at 28, of the body of the die 20 disposed between the slots 26 enable the fins to be placed closer together. The triangular portions 28 in the die are much stronger when they fan out as illustrated in FIG. 2 than if they were parallel. In a certain embodiment, the die 20 can be fabricated from any suitable material, such as stainless steel.

Figure 3:
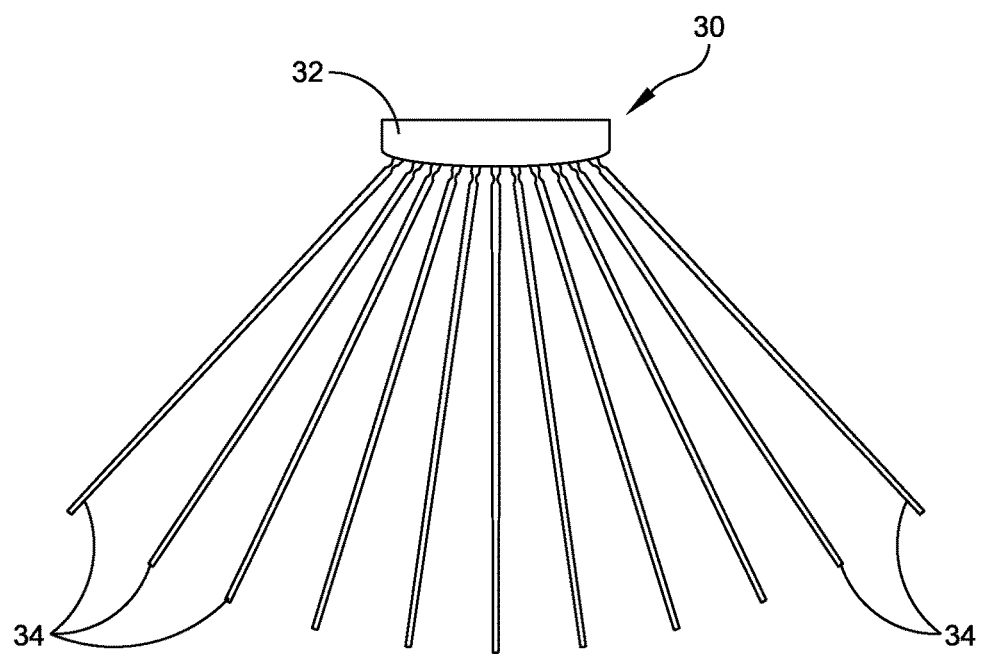
FIG. 3 is an end view of a heat sink of embodiments of the present disclosure shown after an extrusion process.

Referring to FIG. 3, a heat sink, generally indicated at 30, is fabricated by extruding heated material, such as aluminum, when malleable through the die. Other suitable materials, such as aluminum alloys, may also be used to create the heat sink. As shown, the heat sink 30 includes a base 32 and a plurality of fins, each indicated at 34, extending from one side (e.g., the rounded side) of the base in a radial fashion about the base. The fins 34 are long and thin and are closely spaced to one another. In one embodiment, the fins 34 are spaced approximately 2 millimeters (mm) from one another. It should be understood that the die 20 may be configured to produce heat sinks of any size and shape, with any number of fins extending from one side or both sides of the base, and fall within the scope of the instant disclosure.

Figure 4:
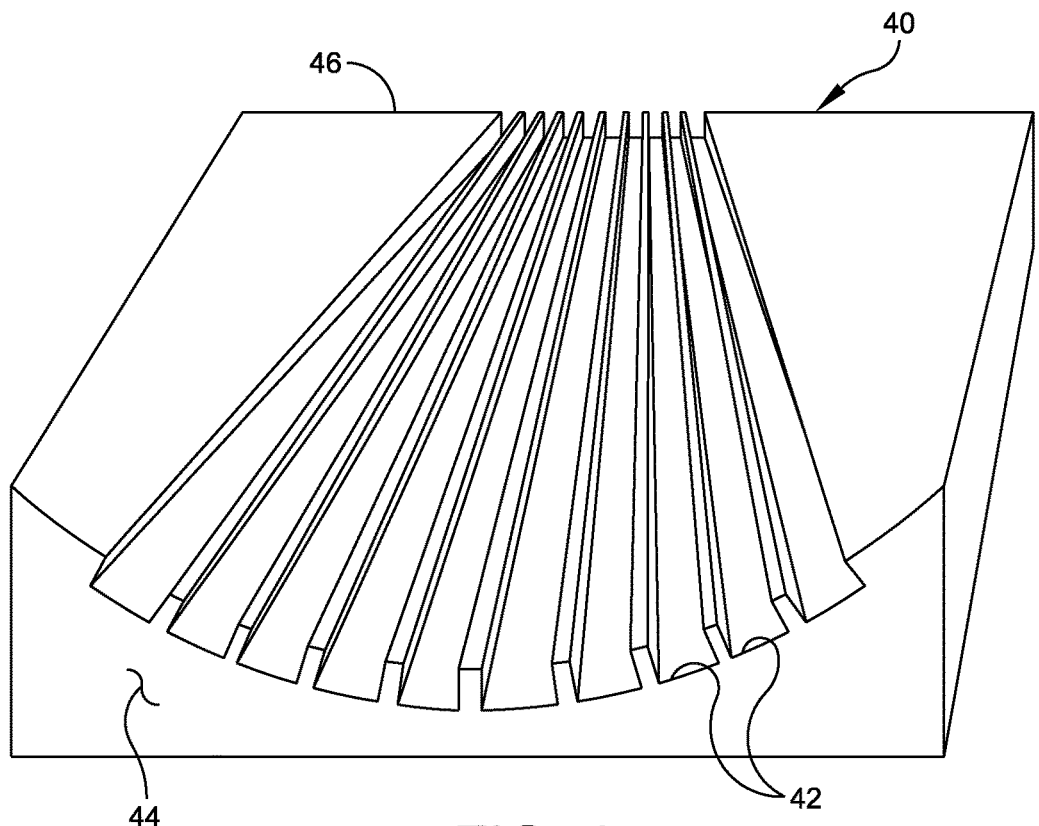
FIG. 4 is a perspective view of a compression tool used to manipulate fins of a heat sink of the present disclosure.

After fabricating the heat sink 30 having flared fins 34 as illustrated in FIG. 3, the fins may be manipulated to achieve a more traditional heat sink appearance having parallel fins. Referring to FIG. 4, in one embodiment, a compression tool, generally indicated at 40, is provided to compress or otherwise manipulate the fins 34 of the heat sink 30 so that the fins extend from the base 32 along planes that are generally parallel to each other. In the shown embodiment, the compression tool 40 includes a body having a plurality of slots, each indicated at 42, that extend from a first end 44 of the compression tool to a second, opposite end 46 of the compression tool. The arrangement is such that the slots 42 at the first end 44 of the compression tool 40 are configured to receive corresponding fins 34 of the heat sink 30 therein. To produce the straight fin configuration, a spacing between adjacent slots 42 of the compression tool 40 at the second end 46 is closer than a spacing between adjacent slots at the first end 44 of the compression tool. In operation, the fins 34 of the flared heat sink 30 are inserted into the slots 42 of the compression tool 40 at the first end 44 of the compression tool. The fins 34 of the heat sink 30 are slid through the slots 42 of the compression tool 40 to achieve the traditional heat sink appearance.

Figure 5:
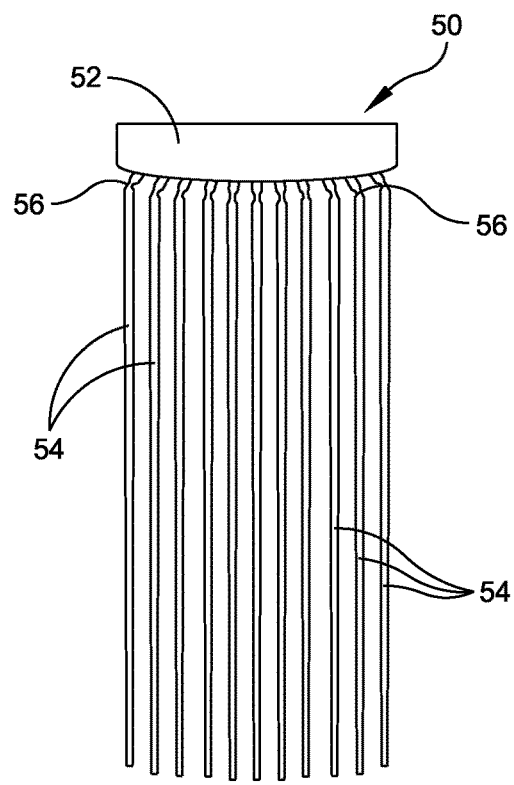
FIG. 5 is an end view of a heat sink of embodiments of the present disclosure shown after a compression process.

FIG. 5 illustrates a heat sink 50 that is produced by extruding a blank of heated material (e.g., aluminum) through a die (e.g., die 20) and compressing the fins of the flared heat sink with a compression tool (e.g., compression tool 40). As shown, the heat sink 50 includes a base 52 having a plurality of fins, each indicated at 54, extending from one side of the base along generally parallel planes.

In a certain embodiment, the material that is extruded through the die 20 is slid through the compression tool 40 when the material is hot. In another embodiment, the material that is extruded through the die 20 is slide through the compression tool 40 when the material is cool. Prior to compressing the fins 34 of the heat sink 30 (shown in FIG. 3) with the compression tool 40, the heat sink 30 may be cut or otherwise segmented to a desired length. The act of segmenting the heat sink 30 may be performed when the heat sink material is hot or cool.

Figure 6:
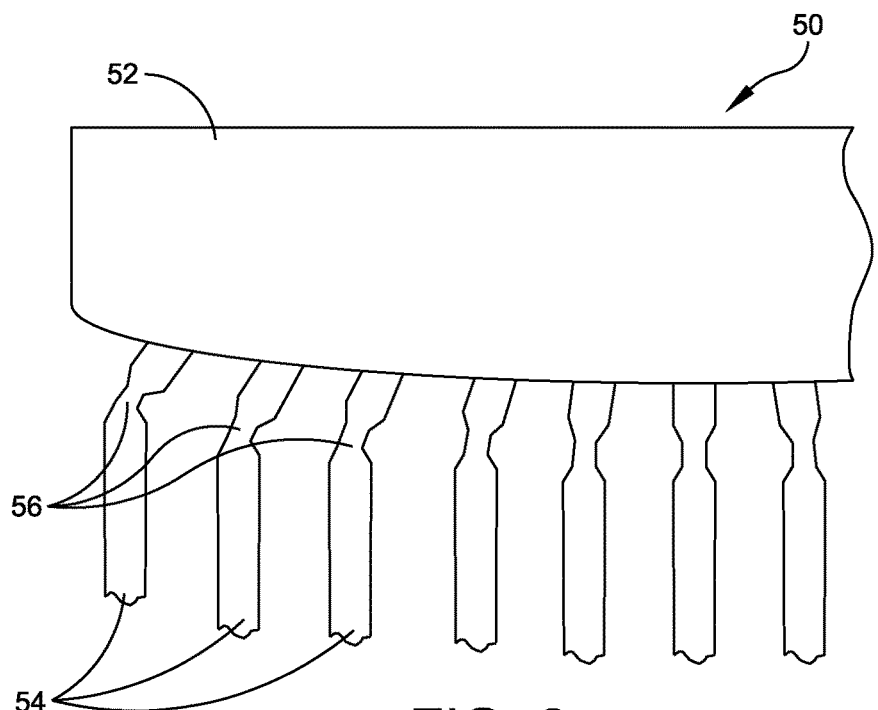
FIG. 6 is an enlarged end view of a portion of the heat sink shown in FIG. 5.

Referring to FIGS. 5 and 6, the fins 54 of the heat sink material are shown extending from the base 52 so that the fins lie along planes that are parallel to one another. In one embodiment, the die 20 is configured to produce a heat sink having, for each fin 54, a reduced thickness portion, each indicated at 56, that is located adjacent to the connection of the fin to the base 52. The reduced thickness portion 56 is best shown in FIG. 6. This construction further enables the movement or bending of the fins 54 at the locations of the reduced thickness portions 56 to manipulate the heat sink from the flared heat sink configuration shown in FIG. 3 to the more traditional heat sink configuration shown in FIG. 5.

Figure 7:
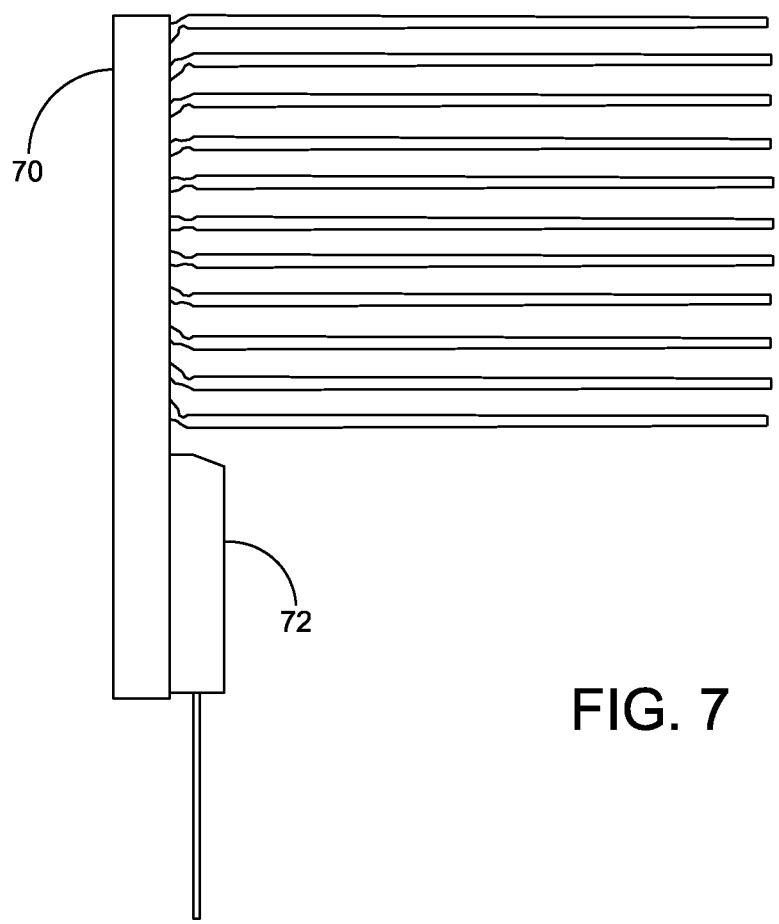
FIG. 7 is an end view of a heat sink attached to an electronic component.

FIG. 7 illustrates a heat sink 70 produced by the method disclosed herein by extruding hot material through the die 20 and compressing the fins of the heat sink so as to achieve common parallel planes with the compression tool 40. As shown, the heat sink 70 is secured to an electronic component 72, such as a semi-conductor housing.

Figures 8A, 8B:
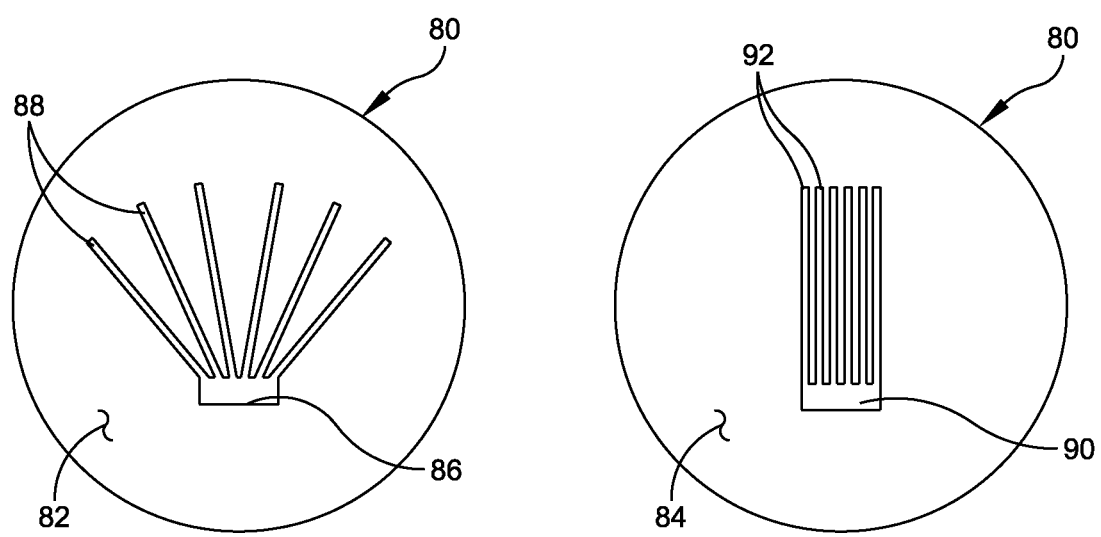
FIGS. 8A and 8B are end views of a die of another embodiment of the present disclosure that is used to extrude a heat sink.

FIGS. 8A and 8B illustrate a die, generally indicated at 80, of another embodiment to produce a heat sink, such as the heat sink 50 shown in FIG. 5. FIG. 8A shows one end 82, which is sometimes referred to as a first end, of the die 80. FIG. 8B shows an opposite end 84, which is sometimes referred to as a second end, of the die 80. The first end 82 of the die 80 has a first opening 86 that is configured to produce a base of a heat sink and a plurality of first slots, each indicated at 88, that extend from one side of the first opening 86 in a radial fashion about the first opening to produce fins of a heat sink. As the hot material travels through the die 80, the material exits the die through the second end 84 of the die. The second end 84 of the die 80 has a second opening 90 corresponding to the first opening 86 of the first end 82 to produce a base of a heat sink and a plurality of second slots, each indicated at 92, extending from one side of the second opening along planes that are generally parallel to one another. As mentioned, the first and second openings 86, 90 are in fluid communication with one another so that the opening extends through the entire die. Similarly, the first slots 88 are in fluid communication with the second slots 92 and extend through the entire die as well. In operation, heated blank material extruded through the die 80 produces a heat sink similar to the heat sink 50 shown in FIG. 5.

The heat sinks produced by the methods disclosed herein may be used in conditions where forced cooling air (e.g., by employing a fan) is used to cool power electronics. The heat sinks may also be used in an uninterruptible power supply or "UPS," where material and production cost is a factor, but many other applications using power electronics may also benefit by the heat sinks disclosed herein. For example, the heat sinks disclosed herein can be used in motor drives, solar converters, and wind turbine power electronics.

Thus, it should be observed that the methods for fabricating heat sinks of the present disclosure produce heat sinks that are as efficient as folded fin and bonded heat sinks that are used with forced cooling. However, heat sinks produced in the manner disclosed herein are less expensive to make than folded fin and bonded heat sinks, approaching the cost structure for extruded heat sinks, and are more efficient, having longer and more closely spaced apart fins. Specifically, a heat sink produced by the methods disclosed herein can achieve greater ratios of length of the fin in relation to the distance between adjacent fins. For example, heat sinks produced by using the die 20 and the compression tool 40 can achieve at least a 30:1 ratio of the length of the fin in relation to the distance between adjacent fins. It is contemplated that such heat sinks can achieve an even higher ratio of length to distance.

It is to be appreciated that embodiments of the devices and methods discussed herein are not limited in application to the details of construction and the arrangement of components set forth in the following description or illustrated in the accompanying drawings. The devices and methods are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A method for fabricating a straight fin heat sink of the type comprising a base and a plurality of fins extending from the base, each fin of the plurality of fins being spaced from one another a predetermined distance and lying along a plane parallel to planes of the other fins of the plurality of fins, the method comprising:
   providing a die configured to produce a heat sink having a base and a plurality of fins attached to the base in a radial fashion about the base from at least one side of the base;
   extruding a blank of material through the die to produce the heat sink; and
   compressing the plurality of fins with a compression tool so that the plurality of fins extend from the base along planes parallel to each other,
   wherein compressing the plurality of fins with a compression tool includes
      providing a compression tool having a plurality of slots that extend from a first end of the compression tool to a second, opposite end of the compression tool, the plurality of slots at the first end of the compression tool being configured to receive the plurality of fins of the heat sink therein, and
      sliding the plurality of fins of the heat sink through the slots of the compression tool.

2. The method of claim 1, wherein the die is further configured to produce a heat sink having, for each fin of the plurality of fins, a reduced thickness portion adjacent to a connection of the fin to the base.

3. The method of claim 1, further comprising, prior to compressing the plurality of fins, segmenting the heat sink to a desired length.

4. The method of claim 1, wherein a spacing of the slots of the compression tool at the second end is closer together than a spacing of the slots of the compression tool at the first end.

5. The method of claim 1, wherein the material extruded through the die is compressed while the material is hot.

6. The method of claim 5, further comprising, prior to compressing the plurality of fins, segmenting the heat sink to a desired length.

7. The method of claim 1, wherein the material extruded through the die is compressed while the material is cool.

8. The method of claim 7, further comprising, prior to compressing the plurality of fins, segmenting the heat sink to a desired length.

* * * * *